United States Patent
Konishi

(10) Patent No.: US 9,085,138 B2
(45) Date of Patent: Jul. 21, 2015

(54) PIEZOELECTRIC DEVICE, LIQUID EJECTING APPARATUS, AND METHOD OF DRIVING PIEZOELECTRIC DEVICE AND LIQUID EJECTING HEAD

(71) Applicant: SEIKO EPSON CORPORATION, Tokyo (JP)

(72) Inventor: Akio Konishi, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/464,419

(22) Filed: Aug. 20, 2014

(65) Prior Publication Data

US 2015/0054870 A1 Feb. 26, 2015

(30) Foreign Application Priority Data

Aug. 21, 2013 (JP) ................. 2013-171721

(51) Int. Cl.

| | |
|---|---|
| *B41J 29/38* | (2006.01) |
| *B41J 2/045* | (2006.01) |
| *B41J 2/14* | (2006.01) |
| *H02P 31/00* | (2006.01) |
| *H01L 41/047* | (2006.01) |
| *H01L 41/187* | (2006.01) |

(52) U.S. Cl.
CPC .......... *B41J 2/04588* (2013.01); *B41J 2/04541* (2013.01); *B41J 2/04581* (2013.01); *B41J 2/04591* (2013.01); *B41J 2/14201* (2013.01); *H01L 41/0472* (2013.01); *H01L 41/187* (2013.01); *H02P 31/00* (2013.01)

(58) Field of Classification Search
CPC ............. B41J 2/04588; B41J 2/04591; B41J 2/04541; B41J 2/14201; B41J 2/04581; H01L 41/187; H01L 41/0472; H02P 31/00
See application file for complete search history.

(56) References Cited

U.S. PATENT DOCUMENTS

| | | |
|---|---|---|
| 2007/0241642 A1 | 10/2007 | Miyazawa et al. |
| 2013/0215174 A1* | 8/2013 | Konishi ................. 347/10 |

FOREIGN PATENT DOCUMENTS

JP 2007-287745 11/2007

* cited by examiner

Primary Examiner — Julian Huffman
(74) Attorney, Agent, or Firm — Workman Nydegger

(57) ABSTRACT

A piezoelectric device comprises a piezoelectric element including a piezoelectric layer formed of a complex oxide having a perovskite structure including bismuth, iron, barium, and titanium, and a pair of electrodes placing the piezoelectric layer therebetween. The piezoelectric element is driven with a first drive mode and a second drive mode. In the first drive mode, the piezoelectric element is driven at a first speed, and is held to a first voltage V1 in a first hold process during a first time defined based on a natural period Tc. In the second drive mode, the piezoelectric element is driven at a higher speed than the first speed, and is held to the first voltage V1 in the first hold process during a second time shorter than the first time, and an intermediate voltage Vm is set to be equal to or lower than a voltage corresponding to the coercive electric field Ec.

7 Claims, 7 Drawing Sheets

PIEZOELECTRIC DEVICE, LIQUID EJECTING APPARATUS, AND METHOD OF DRIVING PIEZOELECTRIC DEVICE AND LIQUID EJECTING HEAD

BACKGROUND

1. Technical Field

The present invention relates to a piezoelectric device or a liquid ejecting apparatus including a piezoelectric element. The present invention also relates to. The present invention relates to a method of driving a piezoelectric device and a liquid ejecting head.

2. Related Art

As a representative example of a liquid ejecting head mounted on a liquid ejecting apparatus, for example, there is an ink jet recording head in which a part of a pressure generating chamber communicating with nozzle openings from which ink droplets are discharged is configured by a vibration plate, and which discharges an ink as the ink droplets from the nozzle openings by deforming the vibration plate using a piezoelectric element and pressurizing the ink within the pressure generating chamber.

The piezoelectric material used as a piezoelectric layer configuring such a piezoelectric element requires a high piezoelectric properties and as the representative example of the piezoelectric material, there is lead zirconate titante (PZT). However, from the viewpoint of environmental problems, a non-lead piezoelectric material or a piezoelectric material in which the content of lead is reduced has been required. As the piezoelectric material that does not contain lead, for example, a $BiFeO_3$-based piezoelectric material containing Bi and Fe has been used (for example, see JP-A-2007-287745).

However, since the piezoelectric layer formed of a complex oxide in which lead is removed or the content of lead is reduced does not have a sufficient displacement compared with lead zirconate titanate (PZT), it is necessary to improve displacement.

Such a problem arises not only in the ink jet recording head but also in other heads used in the liquid ejecting apparatus which discharge droplets other than ink. In addition, such a problem also arises in a piezoelectric element which is used in piezoelectric devices other than the liquid ejecting head.

SUMMARY

An advantage of some aspects of the invention is to provide a piezoelectric device or a liquid ejecting apparatus having a low environmental load and a high displacement and a method of driving a piezoelectric device or a liquid ejecting head.

According to an aspect of the invention, there is provided a piezoelectric device, a liquid ejecting head comprising the piezoelectric device, or a liquid ejecting apparatus comprising the liquid ejecting head. The piezoelectric device has a natural period Tc and a coercive electric field Ec. The piezoelectric device comprises: a piezoelectric element including a piezoelectric layer formed of a complex oxide having a perovskite structure including bismuth, iron, barium, and titanium, and a pair of electrodes placing the piezoelectric layer therebetween; and a driver supplying a drive waveform to the piezoelectric element. The drive waveform includes: a standby process of applying intermediate voltage Vm to the piezoelectric element in a standby state; a first voltage change process of changing the voltage applied to the piezoelectric element from the intermediate voltage Vm to a first voltage V1 having a polarity opposite to a polarity of the intermediate voltage Vm; a first hold process of holding the voltage applied to the piezoelectric element to the first voltage V1; a second voltage change process of changing the voltage applied to the piezoelectric element from the first voltage V1 to a second voltage V2 having a polarity same as the intermediate voltage Vm and higher value than the intermediate voltage Vm; and a second hold process of holding the voltage applied to the piezoelectric element to the second voltage V2. The piezoelectric element is driven with a first drive mode and a second drive mode. In the first drive mode, the piezoelectric element is driven at a first speed, and is held the first voltage V1 in a first hold process during a first time defined based on the natural period Tc. In the second drive mode, the piezoelectric element is driven at a higher speed than the first speed, and is held the first voltage V1 in a first hold process during a second time shorter than the first time, and the intermediate voltage Vm is set to be equal to or lower than a voltage corresponding to the coercive electric field Ec.

According to the aspect, since the piezoelectric element is driven by using the drive waveform in which the intermediate voltage Vm is set to be equal to or lower than the voltage corresponding to the coercive electric field Ec in the second drive mode, it is possible to promote polarization relaxation in a low electric field, then possible to apply a voltage that is higher than the first voltage to the piezoelectric element in the state where the polarization relaxation is promoted, and then possible to achieve a large displacement. In addition, since a non-lead piezoelectric material, that is, a piezoelectric material not containing lead or a piezoelectric material containing a small amount of lead is used, an environmental load is low.

Herein, in the first drive mode, it is preferable that the driver sets the intermediate voltage Vm to be higher than the voltage corresponding to the coercive electric filed Ec. Accordingly, the hold time at the first voltage becomes longer and polarization relaxation easily occurs even in a strong electric field, and thus, it is possible to achieve a large displacement.

Further, in the first drive mode, it is preferable that the driver sets an absolute value of the intermediate voltage Vm to be higher than a voltage difference between the first voltage V1 and the second voltage V2. Accordingly, the displacement is increased depending on the absolute value of the intermediate voltage, and thus, it is possible to achieve a large displacement.

According to another aspect of the invention, there is provided a method of driving a piezoelectric device having a natural period Tc and a coercive electric field Ec, or a liquid ejecting head comprising the piezoelectric device. The piezoelectric device includes a piezoelectric element comprising a piezoelectric layer formed of a complex oxide having a perovskite structure including bismuth, iron, barium, and titanium, and a pair of electrodes placing the piezoelectric layer therebetween. The piezoelectric element is driven with a first drive mode and a second drive mode. The method comprises: a standby process of applying intermediate voltage Vm to the piezoelectric element in a standby state; a first voltage change process of changing the voltage applied to the piezoelectric element from the intermediate voltage Vm to a first voltage V1 having a polarity opposite to a polarity of the intermediate voltage Vm; a first hold process of holding the voltage applied to the piezoelectric element to the first voltage V1; a second voltage change process of changing the voltage applied to the piezoelectric element from the first voltage V1 to a second voltage V2 having a polarity same as the intermediate voltage Vm and higher value than the intermediate voltage Vm; and a second hold process of holding the voltage applied to the piezoelectric element to the second voltage V2. In the first drive mode, the method comprises driving the piezoelectric element at a first speed, and holding the first voltage V1 in the first hold process during a first time defined based on the natural period Tc. In the second drive mode, the method comprises driving the piezoelectric element at a higher speed than the first speed, holding the first voltage V1 in the first hold process during a second time shorter than the first time, and setting the intermediate voltage Vm to be equal to or lower than a voltage corresponding to the coercive electric field Ec.

According to the aspect, since the piezoelectric element is driven by using the drive waveform in which the intermediate voltage Vm is set to be equal to or lower than the voltage corresponding to the coercive electric field Ec in the second drive mode, it is possible to promote polarization relaxation in a low electric field, then possible to apply a voltage that is higher than the first voltage to the piezoelectric element in the state where the polarization relaxation is promoted, and then possible to achieve a large displacement. In addition, since a non-lead piezoelectric material, that is, a piezoelectric material not containing lead or a piezoelectric material containing a small amount of lead is used, an environmental load is low.

BRIEF DESCRIPTION OF THE DRAWINGS

Embodiments of the invention will now be described by way of example only with reference to the accompanying drawings, wherein like numbers reference like elements.

DESCRIPTION OF EXEMPLARY EMBODIMENTS

First Embodiment

Figure 1:
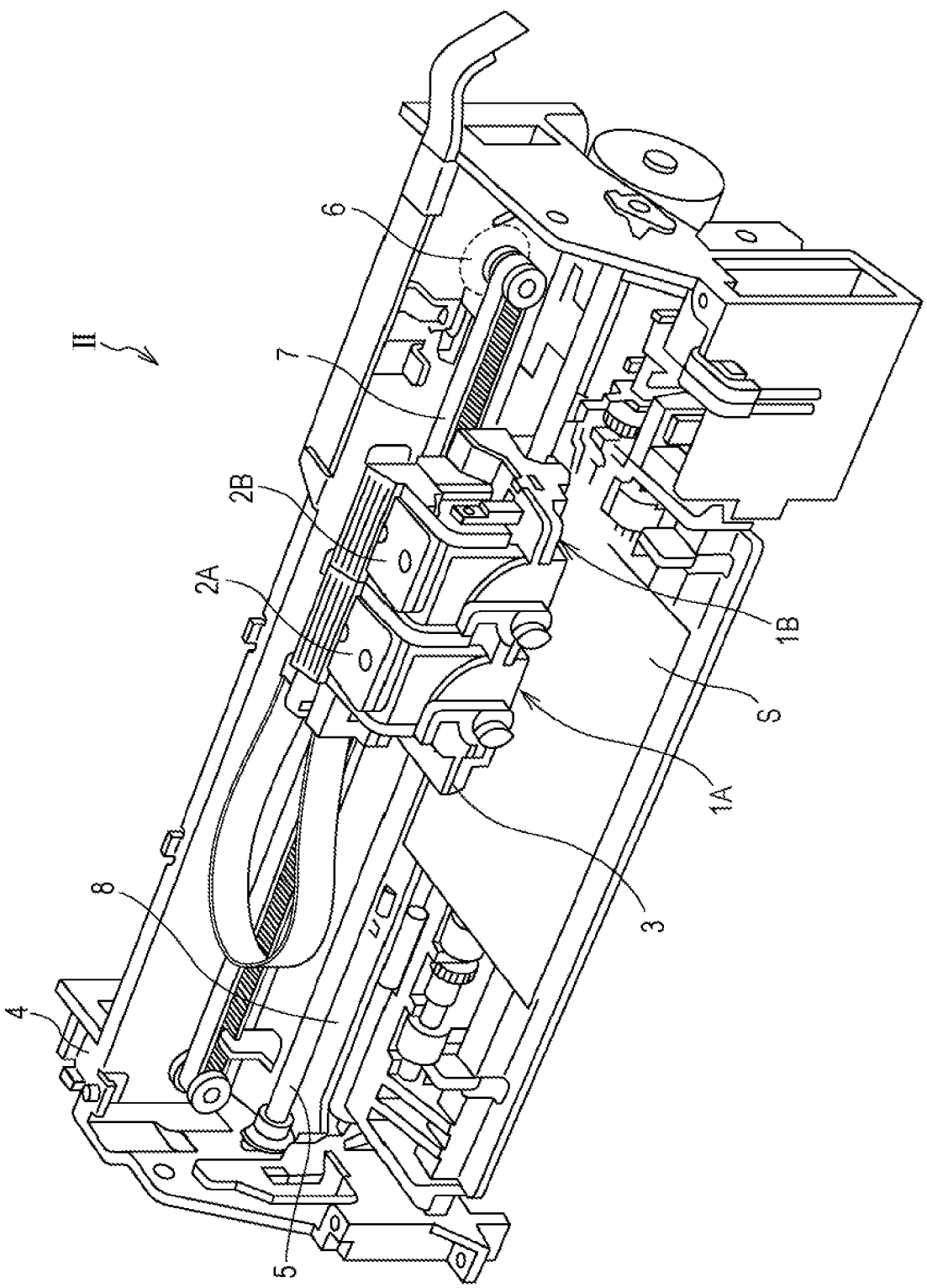
FIG. 1 is a view illustrating a schematic configuration of an ink jet recording apparatus according to an embodiment of the invention.

FIG. 1 is a schematic view illustrating an example of an ink jet recording apparatus as an example of a liquid ejecting apparatus according to the invention. As illustrated in FIG. 1, in the ink jet recording apparatus II, recording head units 1A and 1B having ink type jet recording heads are provided with cartridges 2A and 2B configuring an ink supply to be attachable and detachable, and a carriage 3 which is equipped with the recording head units 1A and 1B is provided to be movable in an axial direction on a carriage shaft 5 attached to an apparatus main body 4. For example, the recording head units 1A and 1B respectively discharge black ink composition and color ink composition.

Therefore, the drive force of the a drive motor 6 is transmitted to the carriage 3 via plural gears (not illustrated) and a timing belt 7, and the carriage 3 equipped with the recording head units 1A and 1B is moved along the carriage shaft 5. Meanwhile, the apparatus main body 4 is provided with a platen 8 along the carriage shaft 5 and a recording sheet S that is a recording medium such as paper fed by a paper feeding roller (not illustrated) or the like is wound around a platen 8 to be transported.

Here, the ink jet recording head mounted in the ink jet recording apparatus II will be described with reference to FIGS. 2 to 4. In addition, FIG. 2 is an exploded perspective view illustrating a schematic configuration of the ink jet recording head as an example of the liquid ejecting apparatus according to the first embodiment of the invention, FIG. 3 is a plan view of FIG. 2, and FIG. 4 is a cross-sectional view taken along the line IV-IV of FIG. 3.

Figure 2:
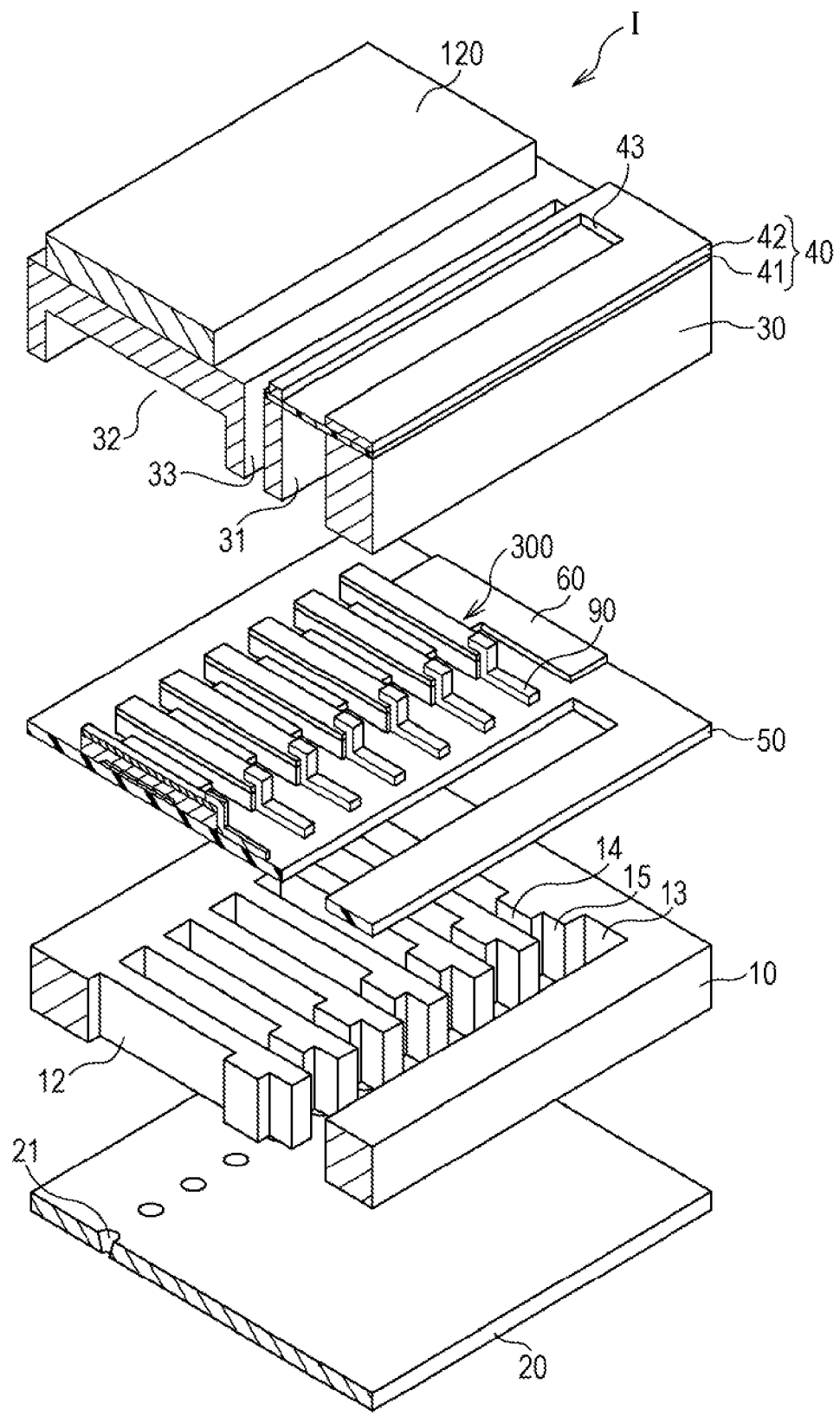
FIG. 2 is an exploded perspective view illustrating a schematic configuration of a recording head according to a first embodiment.
Figure 3:
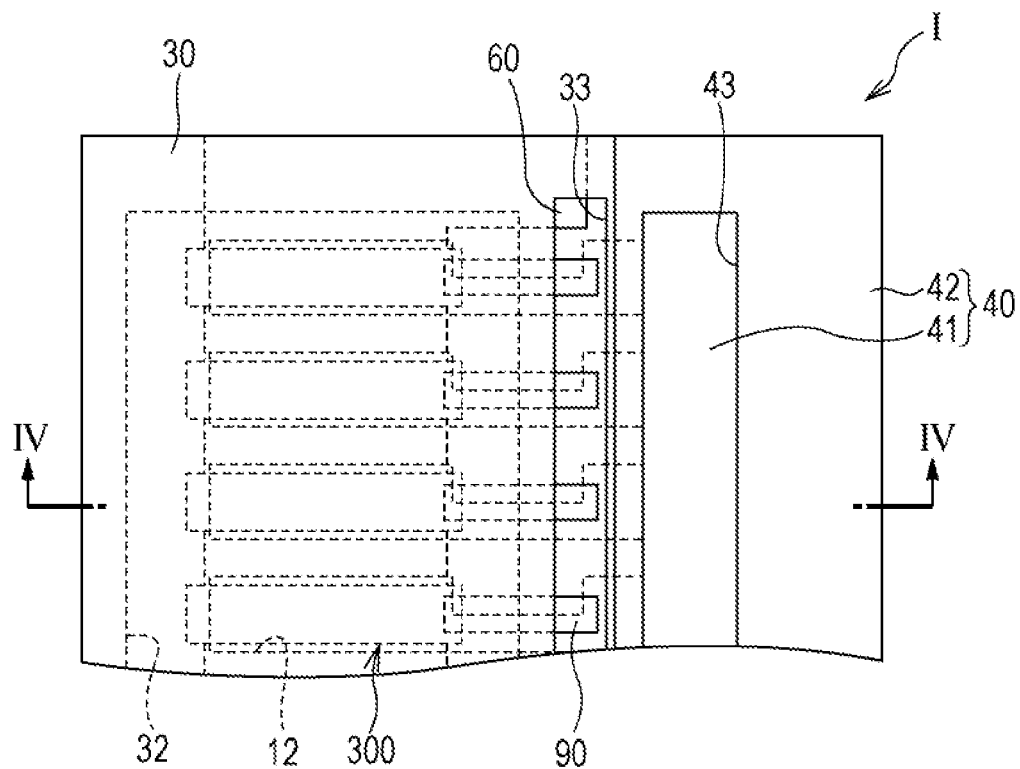
FIG. 3 is a plan view of the recording head according to the first embodiment.
Figure 4:
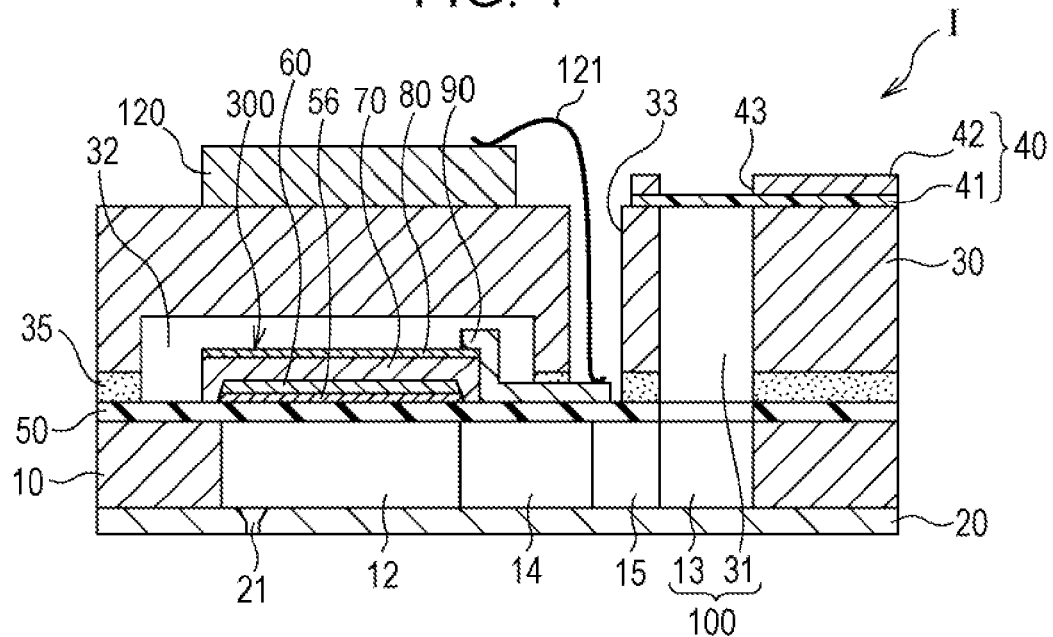
FIG. 4 is a cross-sectional view of the recording head according to the first embodiment.

As illustrated in FIGS. 2 to 4, a flow path forming substrate 10 of the embodiment is formed of a signal crystalline silicon substrate and an elastic film 50 formed of silicon dioxide is formed on one surface thereof.

The flow path forming substrate 10 has plural pressure generating chambers 12 arranged in the width direction thereof. In addition, a communication portion 13 is formed in an area outside the pressure generating chamber 12 of the flow path forming substrate 10 in the longitudinal direction, and the communication portion 13 and each of the pressure generating chambers 12 communicate with each other via an ink supply path 14 provided for each of the pressure generating chambers 12 and the communication path 15. The communication portion 13 configures a part of a manifold 100 that functions as a common ink chamber of each of the pressure generating chambers 12 by communicating with a manifold portion 31 of a protective substrate which will be described below. The ink supply path 14 is formed to have a narrower width than that of the pressure generating chambers 12 and constantly maintains the flow path resistance of the ink flowing into the pressure generating chambers 12 from the communication portion 13. In addition, in the embodiment, the ink supply path 14 is formed by narrowing the width of the flow path from one side thereof, but the ink supply path may be formed by narrowing the width of the flow path from both sides thereof. In addition, instead of narrowing the width of the flow path, the ink supply path may be formed by narrowing the width of the flow path from the thickness direction. In the embodiment, a liquid flow path including the pressure generating chamber 12, the communication portion 13, the ink supply path 14 and the communication path 15 is provided on the flow path forming substrate 10.

In addition, a nozzle plate 20 in which a nozzle opening 21 communicating with the vicinity of the end portion of the opposite side of the ink supply path 14 of each pressure generating chamber 12 is drilled is fixedly attached to an opening surface side of the flow path forming substrate 10 using an adhesive or a heat welding film or the like. In addition, for example, the nozzle plate 20 is formed of a glass ceramic, a single silicon crystalline substrate, stainless steel and the like.

Meanwhile, the elastic film 50 is formed on the opposite side of the opening surface of the flow path forming substrate 10 as described above, for example, titanium oxide having a thickness of 30 nm to 50 nm is formed on the elastic film 50, is provided with an adhesion layer for improving the adhesion to a base of a first electrode 60 of the elastic film 50 and the like. In addition, an insulator film formed of zirconium oxide or the like may be provided on the elastic film 50 when necessary.

Further, the first electrode 60, a piezoelectric layer 70 that is a thin film having a thickness of 3 μm or less, preferably 0.3 μm to 1.5 μm, and a second electrode 80 are laminated on the adhesion layer to configure a piezoelectric element 300 as a pressure generator which generates a pressure change in the pressure generating chambers 12. Here, piezoelectric element 300 refers to a portion including the first electrode 60, a piezoelectric layer 70 and the second electrode 80. Generally, any one electrode of the piezoelectric element 300 is set as a common electrode, and the other electrode and the piezoelectric layer 70 are patterned for each of the pressure generating chambers 12 to configure the piezoelectric element 300. In the embodiment, the first electrode 60 is set as the common electrode of the piezoelectric element 300 and the second electrode 80 is set as an individual electrode of the piezoelectric element 300. However, there is no problem even when the setting is reversed for convenience of a drive circuit or wiring. In addition, a combination of the piezoelectric element 300 and the vibration plate on which a displacement is generated due to the drive of the piezoelectric element 300 is referred to as an actuator device. In addition, in the above-described example, the elastic film 50, the adhesion layer, the first electrode 60 and the insulator film provided when necessary act as the vibration plate, but are not limited to thereto. For example, the elastic film 50 or the adhesion layer may be not provided. In addition, the piezoelectric element 300 itself may substantially function as the vibration plate.

In addition, in the embodiment, the piezoelectric material configuring the piezoelectric layer 70 is formed of a complex oxide having a perovskite structure including bismuth (Bi), iron (Fe), barium (Ba) and titanium (Ti). In the perovskite structure, that is, an $ABO_3$ type structure, the A site is coordinated with twelve oxygen atoms, and the B site is coordinated with six oxygen atoms to form an octahedron. Bi and Ba are located at the A site, and Fe and Ti are located at the B site.

Such a complex oxide having the perovskite structure including Bi, Fe, Ba and Ti is represented as a complex oxide having a perovskite structure of a mixed crystal of bismuth ferrate and barium titanate, or as a solid solution in which bismuth ferrate and barium titanate are uniformly solid-soluted. However, compositions deviating from the composition represented as the mixed crystal or the solid solution may be included. Even when the composition is represented as the mixed crystal or the solid solution, bismuth ferrate and barium titanate are not solely detected in the X-ray diffraction pattern.

Here, bismuth ferrate and barium titanate are known piezoelectric materials respectively having a perovskite structure and bismuth ferrate and barium titanate respectively having various compositions have been known. For example, one in which one of the elements (Bi, Fe, Ba, Ti, and O) is deficient or is in excess, or one of the elements is substituted with other elements, in addition to $BiFeO_3$ and $BaTiO_3$, has been known as bismuth ferrate and barium titanate. However, in a case of being represented as bismuth ferrate and barium titanate in the invention, one whose composition deviates from the composition in terms of stoichiometry due to loss and excess and one in which one of the elements is substituted with other elements are also included in the range of bismuth ferrate and barium titanate. The ratio of bismuth ferrate and barium titanate can also be variously changed.

The composition of the piezoelectric layer 70 including the complex oxide having such a perovskite structure, for example, is represented as a mixed crystal which is represented by Expression (1) described below. In addition, Expression (1) can be also represented by Expression (1') described below. Here, Expressions (1) and (1') represent the composition based on the stoichiometry, and naturally, unavoidable deviation in the compositions due to the lattice mismatch, the oxygen deficiency or the like as well as the partial substitution of elements or the like are permitted as long as it is possible to have a perovskite structure as described above. For example, when the stoichiometric ratio is 1, the stoichiometric ratio within the range of 0.85 to 1.20 is permitted. Even when substances are different from each other when represented by the expressions as described below, substances having the same ratio of the elements in the A site and the elements in the B site are considered to be the same complex oxide in some cases.

$$(1-x)[BiFeO_3]\text{-}x[BaTiO_3] \quad (1)$$

$(0<x<0.40)$ $$(Bi_{1-x}Ba_x)(Fe_{1-x}Ti_x)O_3 \quad (1')$$

$(0<x<0.40)$

In addition, the complex oxide constituting the piezoelectric layer 70 may further include elements other than Bi, Fe, Ba and Ti. Examples of other elements include Mn, Co, Cr, or the like. When the complex oxide includes other elements, it is preferable to have a perovskite structure.

When the piezoelectric layer 70 includes Mn, Co and Cr, Mn, Co and Cr are the complex oxides having a structure which is located at B site in the perovskite structure. For example, when Mn is included, the complex oxide constituting the piezoelectric layer 70 is represented as a complex oxide having a structure in which a part of Fe of a solid solution in which bismuth ferrate and bismuth titanate are uniformly dissolved is substituted with Mn, or having a perovskite structure of a mixed crystal of bismuth ferrate manganate and barium titanate. It is found that the fundamental properties are the same as those of the complex oxide having a perovskite structure of a mixed crystal of bismuth ferrate and barium titanate, but the leak properties are improved. In addition, when Co and Cr are included, the leak properties are improved as in the case of including Mn. In the X-ray diffraction pattern, bismuth ferrate, barium titanate, bismuth ferrate manganate, bismuth cobalt ferrate, and bismuth ferrate chromate are not solely detected. The description is given taking Mn, Co, and Cr as an example but it is found that the leak properties are improved similarly also when two elements of other transition metal elements are simultaneously included, and the elements can be formed into the piezoelectric layer 70. Furthermore, other known additives may also be included in order to improve the properties.

For example, the piezoelectric layer 70 including such a complex oxide containing Mn, Co, and Cr in addition to Bi, Fe, Ba, and Ti and having a perovskite structure is a mixed crystal represented by Expression (2) described below. The expression (2) can also be represented by the following expression (2') described below. In the expressions (2) and (2'), M represents Mn, Co, or Cr. Here, Expressions (2) and (2') represent the composition based on the stoichiometry. As described above, unavoidable deviation in the compositions due to the lattice mismatch, the oxygen deficiency or the like as long as it is possible to have a perovskite structure. For example, when the stoichiometric ratio is 1, the stoichiometric ratio within the range of 0.85 to 1.20 is permitted. Even when substances are different from each other when represented by the expressions as described below, substances having the same ratio of the elements in the A site and the elements in the B site are considered to be the same complex oxide in some cases.

 (2)

(0<x<0.40, 0.01<y<0.10)

 (2')

(0<x<0.40, 0.01<y<0.10)

A lead electrode 90, which contains, for example, gold (Au) or the like and is drawn out from the vicinity of the end portion on the side of the ink supply path 14 to be extended to the elastic film 50 and an insulator film to be provided as necessary is connected to each of the second electrode 80 which are individual electrodes of such piezoelectric elements 300.

Onto the flow path forming substrate 10 on which such piezoelectric elements 300 are formed, that is, on the first electrode 60, the elastic film 50, and the insulator film to be provided as necessary, and the lead electrode 90, a protective substrate 30 having the manifold portion 31 constituting at least one part of the manifold 100 is bonded with an adhesive 35. In the embodiment, the manifold portion 31 is formed by penetrating the protective substrate 30 in the thickness direction over the width direction of the pressure generating chambers 12 and is made to communicate with the communication portion 13 of the flow path forming substrate 10 to constitute the manifold 100 which functions as a common ink chamber of each of the pressure generating chambers 12 as described above. In addition, the communication portion 13 of the flow path forming substrate 10 may be divided into plural parts for each of the pressure generating chambers 12, so that only the manifold portion 31 may be used as a manifold. Furthermore, for example, only the pressure generating chambers 12 may be provided in the flow path forming substrate 10, and the ink supply paths 14 communicating with the manifold 100 and each of the pressure generating chambers 12 may be provided in a member (for example, the elastic film 50, the insulator film to be provided as necessary, and the like) interposed between the flow path forming substrate 10 and the protective substrate 30.

In an area facing the piezoelectric element 300 of the protective substrate 30, a piezoelectric element holding portion 32 which has a space large enough not to inhibit the movement of the piezoelectric element 300 is provided. The piezoelectric element holding portion 32 may have a space large enough not to inhibit the movement of the piezoelectric element 300, and the space may or may not be sealed.

As for such a protective substrate 30, materials having substantially the same coefficient of thermal expansion as that of the flow path forming substrate 10, for example, glass and ceramic materials, are preferably used. In this embodiment, a silicon single crystal substrate which is the same material as that of the flow path forming substrate 10 is used for the formation thereof.

The protective substrate 30 is provided with a through hole 33 penetrating the protective substrate 30 in the thickness direction. The vicinity of the end portion of the lead electrode 90 that is drawn out from each of the piezoelectric elements 300 is provided so as to be exposed to the inside of the through hole 33.

A drive circuit 120 for driving the piezoelectric elements 300 arranged in parallel is fixed to the protective substrate 30. As the drive circuit 120, for example, a circuit substrate, a semiconductor integrated circuit (IC), or the like can be used. The drive circuit 120 and the lead electrode 90 are electrically connected through a connection wiring 121 including an electrically conductive wire, such as a bonding wire.

In addition, a compliance substrate 40 including a sealing film 41 and a fixation plate 42 is bonded to such a protective substrate 30. Here, the sealing film 41 is formed with a material having a low rigidity and flexibility, and one surface of the manifold portion 31 is sealed by the sealing film 41. The fixation plate 42 is formed with a relatively hard material. An area facing the manifold 100 of the fixation plate 42 is completely removed in the thickness direction to form an opening portion 43, and therefore, one surface of the manifold 100 is sealed only by the sealing film 41 having flexibility.

In such an ink jet recording head I of the embodiment, ink is taken in from an ink introduction port connected to the ink supply (not illustrated), the inside of a space from the manifold 100 to the nozzle opening 21 is filled with the ink, and then, a voltage is applied between the first electrode 60 and the second electrode 80 corresponding to each of the pressure generating chambers 12 according to a recording signal (drive signal) from the drive circuit 120 to cause deformation of the elastic film 50, the adhesion layer, the first electrode 60 and the piezoelectric layer 70 so that the pressure in each of the pressure generating chambers 12 increases and ink droplets are discharged from the nozzle openings 21.

Figure 5:
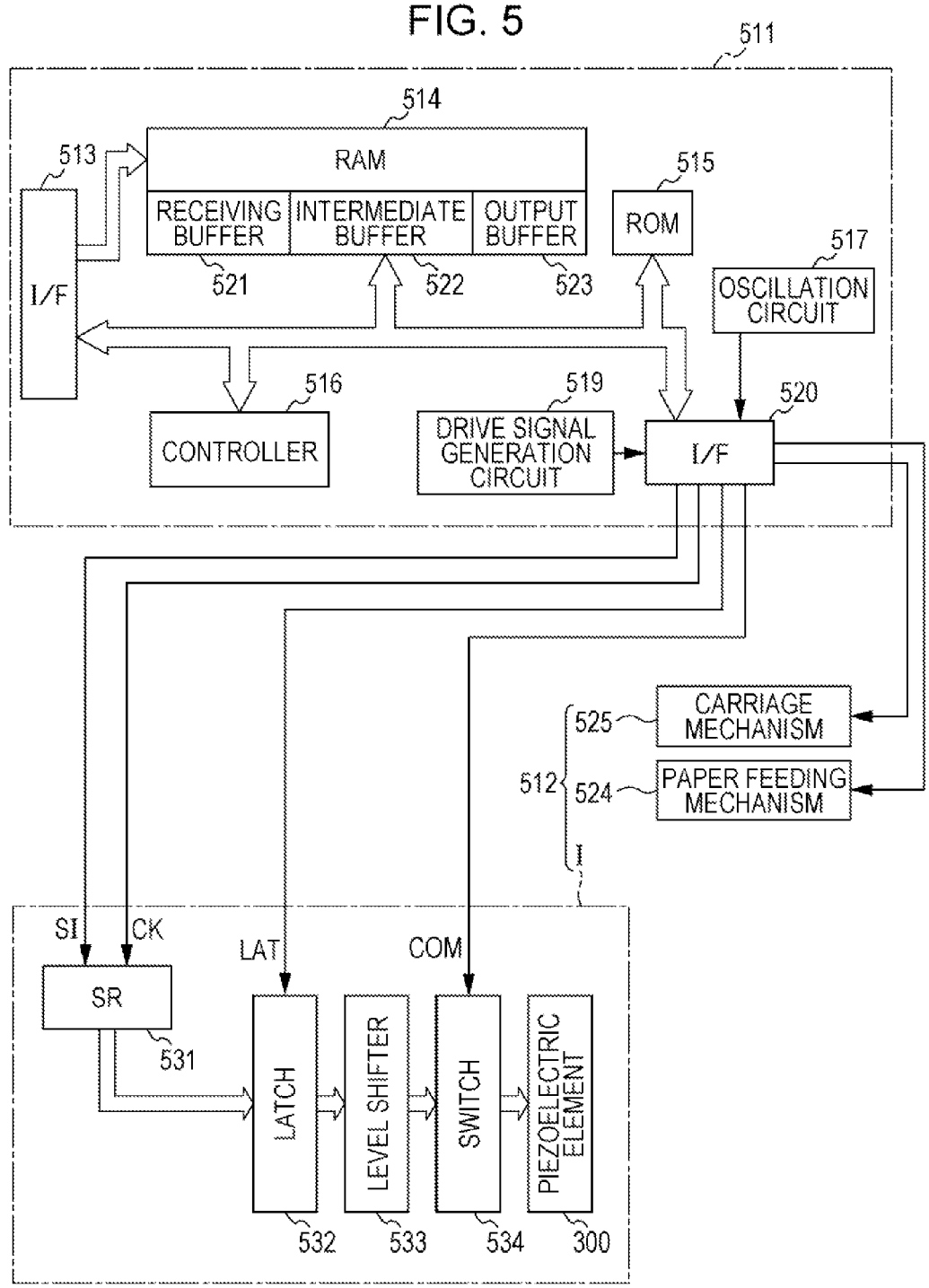
FIG. 5 is a block diagram illustrating a control configuration of the ink jet recording apparatus according to the first embodiment.

FIG. 5 is a block diagram illustrating a control configuration of such an ink jet recording apparatus. Hereinafter, the control of the ink jet recording apparatus according to the embodiment will be described with reference to FIG. 5. As illustrated in FIG. 5, the ink jet recording apparatus according to the embodiment is generally configured with a printer controller 511 and a print engine 512. The printer controller 511 includes an external interface 513 (hereinafter, referred to as an "external I/F 513"), a RAM 514 that temporarily stores various kinds of data, a ROM 515 storing a control program or the like, a controller 516 including a CPU and the like, an oscillation circuit 517 that generates a clock signal, a drive signal generation circuit 519 that generates a drive signal to be supplied to the ink jet recording head I, and an internal interface 520 (hereinafter, referred to as "an internal I/F 520") that transmits dot pattern data (bit map data) which is created based on the drive signal and printing data, and the like to the print engine 512.

For example, the external I/F 513 receives printing data configured with character codes, graphics functions, image data or the like from a host computer (not illustrated). In addition, a busy signal (BUSY), an acknowledgement signal (ACK), and the like are output to the host computer or the like via the external I/F 513. The RAM 514 functions as a receiving buffer 521, an intermediate buffer 522, an output buffer 523 and a working memory (not illustrated). The receiving buffer 521 temporarily stores the printing data received by the external I/F 513, the intermediate buffer 522 stores intermediate code data converted by the controller 516, and the output buffer 523 stores dot pattern data. The dot pattern data is configured with printing data obtained by decoding (translating) the tone data.

Further, font data, graphics functions and the like are stored in the ROM 515, in addition to the control program (control routine) for executing various kinds of data processing.

The controller 516 reads out the printing data in the receiving buffer 521 and stores the intermediate code data obtained by converting the printing data in the intermediate buffer 522. In addition, the controller 516 analyzes the intermediate code data read out from the intermediate buffer 522, and creates the dot pattern data from the intermediate code data referring to the font data, the graphics functions and the like that are stored in the ROM 515. Then, the controller 516 executes necessary decoration processing on the created dot pattern data, and thereafter, stores the created dot pattern data in the output buffer 523. Moreover, the controller 516 also functions as a waveform setter, and controls the drive signal generation circuit 519 to set the shape of a waveform of the drive signal output from the drive signal generation circuit 519. The controller 516 configures a driver of the invention in combination with a drive circuit (not illustrated) or the like which will be described later. Further, as a liquid ejection driving apparatus that drives the ink jet recording head I, it is sufficient to include at least this driver. Accordingly, in this embodiment, the driver includes the printer controller 511.

When dot pattern data for one line of the ink jet recording head I is obtained, the dot pattern data for one line is output to the ink jet recording head I via the internal I/F 520. When the dot pattern data for one line is output from the output buffer 523, the converted intermediate code data is deleted from the intermediate buffer 522 and processing for converting the next intermediate code data is executed.

The print engine 512 includes the ink jet recording head I, a paper feed mechanism 524, and a carriage mechanism 525. The paper feed mechanism 524 is configured with a paper feed motor, the platen 8, and the like, and sequentially feeds out print recording media such as recording paper, in cooperation with a recording operation of the ink jet recording head I. In other words, the paper feed mechanism 524 relatively moves the print recording media in a sub scanning direction.

The carriage mechanism 525 is configured with the carriage 3 on which the ink jet recording head I can be mounted and a carriage driving portion that moves the carriage 3 along a main scanning direction, and the movement of the carriage 3 causes the ink jet recording head I to move in the main scanning direction. As described above, the carriage driving portion is configured with the drive motor 6, the timing belt 7 and the like.

The ink jet recording head I has the plural nozzle openings 21 along the sub scanning direction and discharges droplets from each of the nozzle openings 21 at the timing specified by the dot pattern data or the like. Electric signals, such as a drive signal (COM) and recording data (SI) which will be described later, are supplied to the piezoelectric element 300 of the ink jet recording head I via external wiring (not illustrated). In the printer controller 511 and the print engine 512 configured as described above, the printer controller 511 and the drive circuit (not illustrated) function as the driver that applies predetermined drive signals to the piezoelectric element 300; the driving circuit (not illustrated) has a latch 532, a level shifter 533, a switch 534 and the like, and selectively inputs the drive signals, which are output from the drive signal generation circuit 519 and have the predetermined waveforms, to the piezoelectric element 300.

A shift register (SR) 531, the latch 532, the level shifter 533, the switch 534 and the piezoelectric element 300 are provided for each of the nozzle openings 21 of the ink jet recording head I, in which the shift register 531, the latch 532, the level shifter 533 and the switch 534 in cooperation generate a drive pulse from a discharge drive signal, a relaxation drive signal or the like generated by the drive signal generation circuit 519. Here, the drive pulse is an applied pulse that is actually applied to the piezoelectric element 300.

In such an ink jet recording head I, at first, the recording data (SI) configuring the dot pattern data is serially transferred from the output buffer 523 to the shift register 531 to be set therein sequentially, in synchronization with a clock signal (CK) from the oscillation circuit 517. In this case, in the printing data of all the nozzle openings 21, the most significant bit data is serially transferred first, and the second most significant bit data is serially transferred after the most significant bit data is transferred. The remaining bit data is serially transferred sequentially in the order of bit significance in the same manner as described above.

When the bit data of the recording data for all the nozzle openings are set in each of the shift registers 531, the controller 516 outputs a latch signal (LAT) to the latch 532 at a predetermined timing. Upon receiving the latch signal, the latch 532 latches the printing data set in the shift register 531. Recording data (LATout) latched by the latch 532 is applied to the level shifter 533 that is a voltage amplifier. When the recording data is "1", for example, the level shifter 533 boosts the recording data to a voltage value capable of driving the switch 534, for example, to tens of volts. The boosted recording data is applied to each of the switches 534, and each of the switches 534 is put into a connected state by the recording data.

Then, a drive signal (COM) generated by the drive signal generation circuit 519 is applied to each switch 534 and when the switch 534 selectively enters the connected state, the drive signal is selectively applied to the piezoelectric element 300 connected to the switch 534. In this manner, the exemplified ink jet type recording head I can control whether the discharge drive signal is applied to the piezoelectric element 300 depending on the recording data. For example, since the switch 534 is in the connected state in the period in which the recording data is "1" by the latch signal (LAT), the drive signal (COMout) can be supplied to the piezoelectric element 300 and the piezoelectric element 300 is displaced (deformed) by the supplied drive signal (COMout). In addition, since the switch 534 is in a disconnected state in the period in which the recording data is "0", a supply of the drive signal to the piezoelectric element 300 is blocked. Each piezoelectric element 300 holds the immediately previous potential in the period in which the recording is "0" and thereby the immediately previous displacement state is maintained.

The above-described piezoelectric element 300 is a piezoelectric element 300 of a deflecting vibration mode. When the piezoelectric element 300 of the deflecting vibration mode is used, the piezoelectric element 300 and the vibration plate are deflected toward the pressure generating chamber 12 since the piezoelectric layer 70 contracts in the vertical direction of the voltage (in the direction 31) in response to the applied voltage, and thereby the pressure generating chamber 12 contracts. Meanwhile, the piezoelectric element 300 and the vibration plate are deflected to the opposite side of the pressure generating chamber 12 since the piezoelectric layer 70 extends in the direction 31 by reducing the voltage, and thereby the pressure generating chamber 12 expands. Since the volume of the pressure generating chamber 12 is changed with the charging and discharging with respect to the piezoelectric element 300 in such an ink jet recording head I, the droplet can be discharged from the nozzle opening 21 using the pressure variations of the pressure generating chamber 12.

Here, the drive waveform illustrating a drive signal (COM) of the embodiment that is input to the piezoelectric element 300 will be described. In addition, FIG. 6 is the drive waveform illustrating the drive signal of the embodiment.

The drive waveform that is input to the piezoelectric element 300 is applied to an individual electrode (second electrode 80) by setting a common electrode (first electrode 60) to be a reference voltage (Vbs in the embodiment). That is, the voltage applied to the individual electrode (second electrode 80) depending on the drive waveform is illustrated as a reference to show the reference potential (Vbs).

Figure 6:
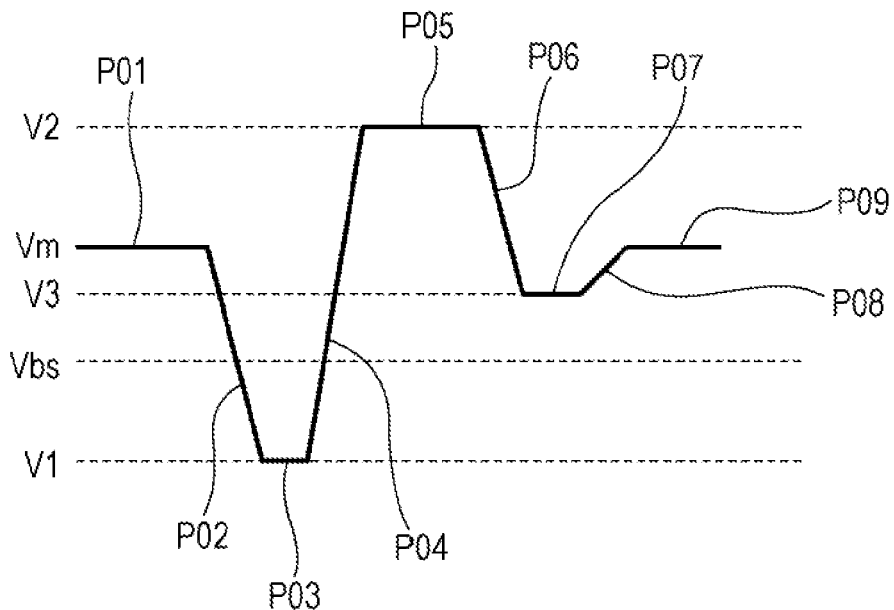
FIG. 6 is a view illustrating an example of a drive signal (drive waveform) according to a first embodiment.

As illustrated in FIG. 6, when the drive waveform which becomes a reference of the embodiment is in a state of preparing to input the drive waveform (drive standby state), for example, the drive waveform is in a state in which an intermediate voltage Vm that is higher than a coercive voltage is applied. Here, the intermediate voltage Vm means a voltage value between a first voltage that expands the pressure generating chamber and a second voltage that contracts the pressure generating chamber. The drive waveform includes a standby process P01 of applying the intermediate voltage Vm, a first voltage change process P02 of expanding the pressure generating chamber 12 by dropping the voltage in the state in which the intermediate voltage Vm is maintained to the first voltage V1 having the polarity opposite to that of the intermediate voltage Vm, a first hold process P03 of maintaining the first voltage V1 for a constant period of time, a second voltage change process P04 of contacting the pressure generating chamber 12 by boosting the voltage from the first voltage V1 to the second voltage V2 that has the polarity opposite to that of the first voltage V1, has the same polarity as the intermediate voltage Vm, and is higher than the intermediate voltage Vm, a second hold process P05 of maintaining the second voltage V2 for a constant period of time, a third voltage change process P06 of expanding the pressure generating chamber 12 by dropping the voltage from the second voltage V2 to a third voltage V3 that is lower than the intermediate voltage Vm, a third hold process P07 of maintaining the third voltage V3 for a constant period of time, a fourth voltage change process P08 of boosting the voltage from the third voltage V3 to the intermediate voltage Vm, and a process P09 of maintaining the intermediate voltage Vm. Here, the third voltage change process P06 of dropping the voltage from the second voltage V2 to a third voltage that is lower than the intermediate voltage Vm, the third hold process P07 of maintaining the third voltage V3 for a constant period of time, and the fourth voltage change process P08 of boosting the voltage from the third voltage V3 to the intermediate voltage Vm are performed for stabilizing the meniscus after the droplet is discharged, and have been known in the related art. However, the processes may be omitted.

A predetermined piezoelectric layer 70 formed of a complex oxide having a perovskite structure including Mn, Co, and Cr in addition to Bi, Fe, and Ba of the invention is not maintained in a polarized state from a state where the power is turned off, and is in a non-polarized state (including a case of a substantially non-polarized state while a small part maintains polarization), and when entering a preparation state (driving standby state) in which the above-described driving waveform 200 is output to the piezoelectric element 300, the piezoelectric layer 70 is in a state in which the intermediate voltage Vm is applied and the piezoelectric layer 70 is in a polarized state. Then, when the above-described driving waveform is input, the voltage is changed from the intermediate voltage Vm to the voltage V1 having the opposite polarity by the first voltage changing process P02, and the polarization of the piezoelectric layer 70 is reduced in the first hold process P03 of maintaining the first voltage V1 for a constant period. At the same time as this, the piezoelectric element 300 is deformed in the direction in which the volume of the pressure generating chamber 12 expands, and the meniscus inside the nozzle opening 21 is drawn toward the pressure generating chamber 12. Next, the piezoelectric element 300 is deformed in the direction in which the volume of the pressure generating chamber 12 contracts by the second voltage changing process P04, and thus, the meniscus inside the nozzle opening 21 is greatly pushed from the pressure generating chamber 12 and the droplets are ejected from the nozzle opening 21.

Here, the displacement is changed depending on the time of the first hold process P03 of maintaining the first voltage V1 in the predetermined piezoelectric layer 70 formed of a complex oxide having a perovskite structure including Mn, Co, and Cr in addition to Bi, Fe, and Ba, and the hold time dependence of the displacement is completed on the basis of the finding that the displacement is changed depending on the absolute value of the intermediate voltage Vm.

Figure 7:
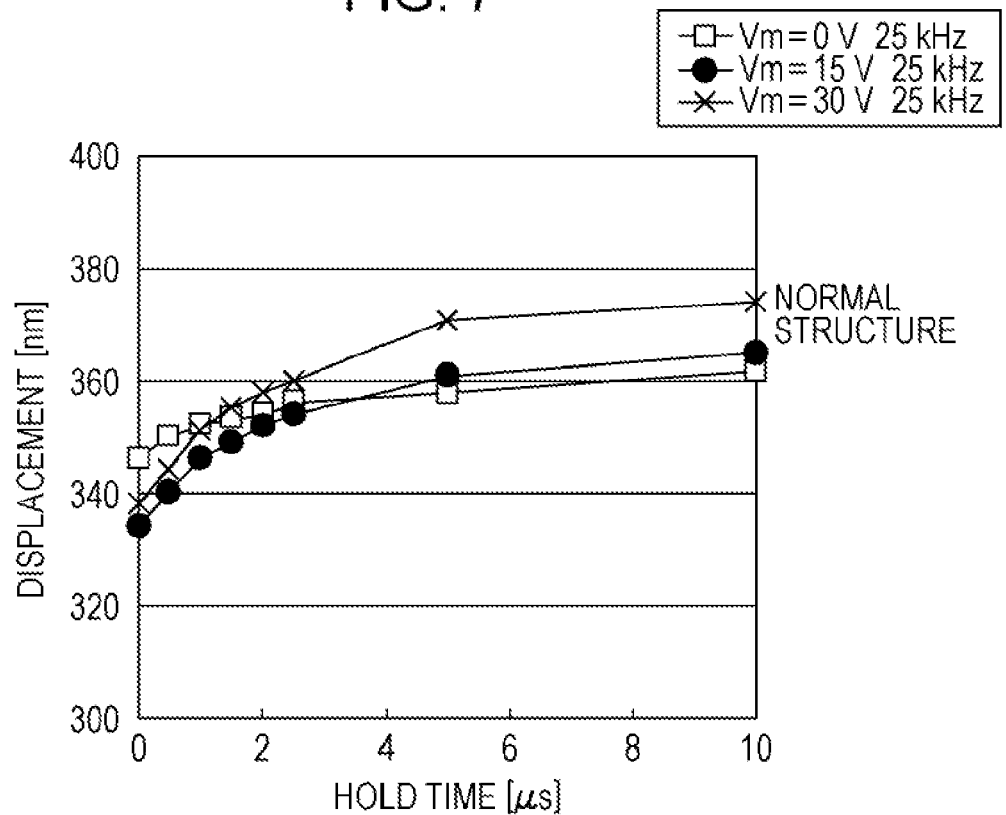
FIG. 7 is a view illustrating a result of a test.

The displacements were measured when the piezoelectric element was driven, by setting a voltage difference ΔV between the first voltage V1 and the second voltage V2 to 35V, using a drive waveform illustrated in FIG. 6 in which the first voltage was set to −4.5 V, setting the intermediate voltage Vm set to 0 V, 15 V, and 30 V, and using a drive waveform in which a first hold time (hold time in the first hold process P03) was changed from 0 μs to 10 μs, with respect to the respective intermediate voltages. By time-integrating speed data measured using a laser Doppler vibrometer manufactured by Graphtec Co., Ltd. with an oscilloscope manufactured by Dekuroi Co., Ltd., the displacement was calculated (25° C.). The measurement sample was processed into the shape of FIG. 3, a segment in which a cavity was formed was used, and measurement was performed by applying each drive waveform. Here, each displacement is represented with a case where Vm and Vmin=0 is standardized as 100. The result is shown in FIG. 7.

From the result, it is understood that as the hold time increases from 0 μs to the vicinity exceeding 2 μs, the displacement is increased, and the increase gradient becomes gentle from the vicinity exceeding 2 μs but the displacement is still increased up to around 10 μs. Particularly, it is understood that in an area in which the hold time is from 0 μs to the vicinity exceeding 2 μs, as the intermediate voltage Vm is decreased, the displacement is increased.

A Natural period Tc is a period of the vibration generated by the piezoelectric element. Generally, in the liquid ejecting head, the hold time in the first hold process P03 is defined by the relationship with a natural period Tc that is determined by the flow path of the liquid to be discharged. Specifically, the hold time is a natural vibration period of the pressure vibration generated in the liquid in the pressure generating chamber by the piezoelectric element. The hold time includes an ideal time based on the environment where the piezoelectric element is placed, for example, flow path structure in case of the liquid ejecting head. The ideal time is equal to or longer than the natural period Tc. In the liquid ejecting head, the ideal time is normally selected since a high quality image is expected. In a first drive mode corresponding to a demand for a high quality image, a drive waveform having a time equal to or longer than the natural period Tc is used. On the other hand, in a second drive mode corresponding to a demand for high-speed printing in spite of slightly deteriorated image quality, a drive waveform having a time shorter than the natural period Tc is used.

In the invention, in such a second drive mode, a drive waveform in which the intermediate voltage Vm is lower than a coercive voltage corresponding to a coercive electric field is used. The coercive voltage of the piezoelectric element 300 is 22 V/μm to 66 V/μm, when converted to an electric field, the voltage is 20 V to 60 V, and a drive waveform in which the intermediate voltage Vm is set to be equal to or lower than the voltage is used. Accordingly, it is possible to obtain greater displacement in the second drive mode.

Incidentally, it is understood that when the piezoelectric element 300 provided with the piezoelectric layer 70 formed of the above-described predetermined piezoelectric material is driven, a large displacement can be ensured in such a manner that the intermediate voltage Vm is set to be equal to or higher than the coercive voltage in the drive waveform to make the piezoelectric element be in a polarized state, the polarization of the piezoelectric layer is reduced by applying the first voltage V1 of $-5$ V/µm to $-$V/µm having the polarity opposite to that of the intermediate voltage Vm from the state in which the intermediate voltage Vm is applied, and a drive waveform for discharging liquid by applying the second voltage V2 that is higher than the intermediate voltage V2 from the state in which the first voltage is applied is used. In the first drive mode, the drive waveform in which the intermediate voltage Vm is higher than the coercive voltage is used.

Including the above-described second drive mode, the first voltage V1 is a negative voltage and is set to $-5$ V to $-15$ V. When converted to an electric field, the voltage is $-5.6$ V/µm to $-16.7$ V/µm. Accordingly, it is possible to maintain the displacement of the piezoelectric layer 70 at a remarkably high level as described later in detail.

In addition, description has been made in which it is preferable that the intermediate voltage Vm be higher than the coercive voltage in the first drive mode, but it is understood that when the intermediate voltage is higher than the voltage difference $\Delta V$ between the first voltage V1 and the second voltage V2, the displacement is further increased.

Figure 8:
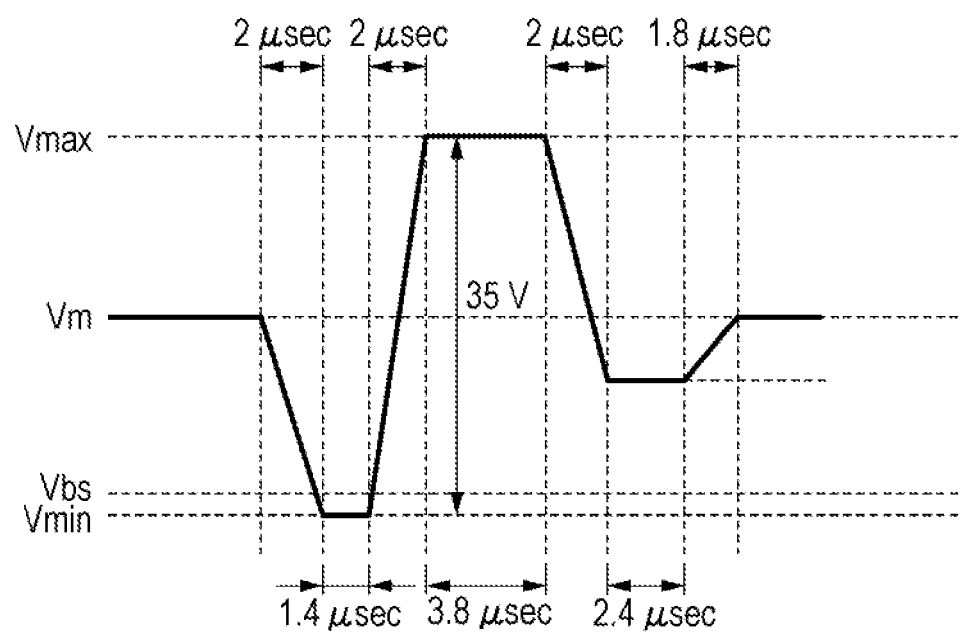
FIG. 8 is a view illustrating a drive waveform used in an experimental example.
Figure 9:
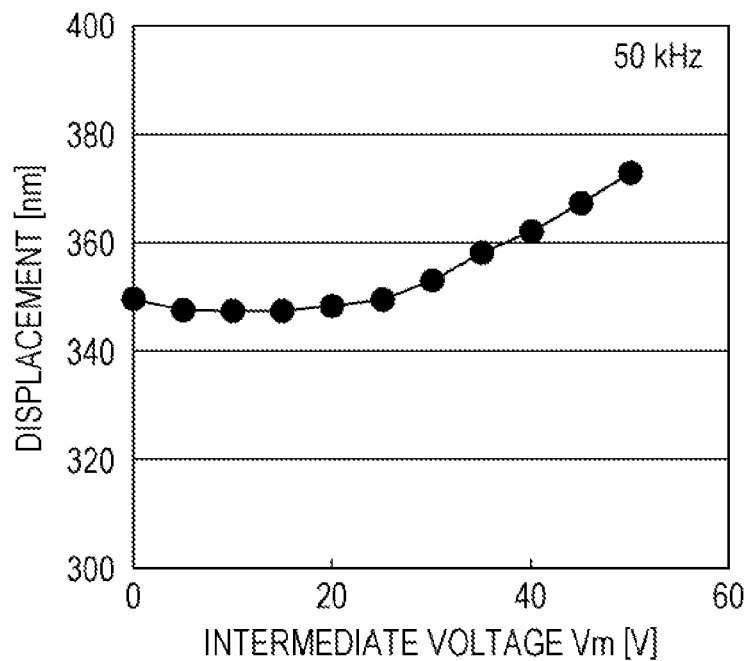
FIG. 9 is a view illustrating a result of a test.

Using the drive waveform illustrated in FIG. 8 as a basic waveform, $\Delta V$ of the drive waveform was set to 35 V as a constant, and the piezoelectric element was driven by using a drive waveform in which Vm was changed. By time-integrating speed data measured using a laser Doppler vibrometer manufactured by Graphtec Co., Ltd. with an oscilloscope manufactured by Dekuroi Co., Ltd., the displacement was calculated (25° C.). The measurement sample was processed into the shape of FIG. 3, a segment in which a cavity was formed was used, and measurement was performed by applying each driving waveform. Here, each displacement is represented with a case where Vm and Vmin=0 is standardized as 100. The result is shown in FIG. 9.

From the result, it is understood that when the intermediate voltage Vm is higher than the $\Delta V$, the displacement is increased. Therefore, it is preferable to use a drive waveform in which the intermediate voltage Vm is higher than $\Delta V$ in the first drive mode.

In addition, it is understood that the displacement further depends on the first voltage V1 in the piezoelectric element 300 of the embodiment.

Figure 10:
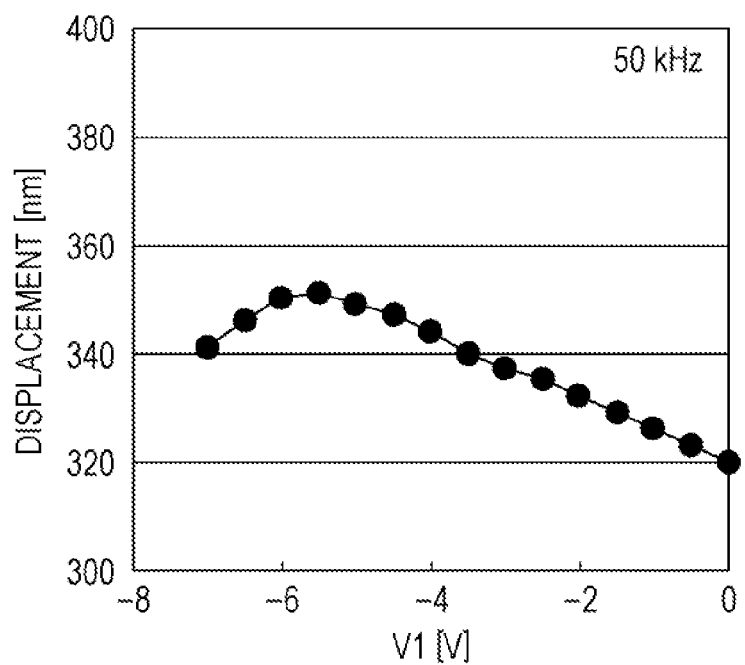
FIG. 10 is a view illustrating a result of a test.

Using the drive waveform illustrated in FIG. 8 as a basic waveform, $\Delta V$ of the drive waveform was set to 35V as a constant, the piezoelectric element was driven by using a drive waveform in which Vm was changed. At this time, the displacement was measured. By time-integrating speed data measured using a laser Doppler vibrometer manufactured by Graphtec Co., Ltd. with an oscilloscope manufactured by Dekuroi Co., Ltd., the displacement was calculated (25° C.) The measurement sample was processed into the shape of FIG. 3, a segment in which a cavity was formed was used, and measurement was performed by applying each driving waveform. Here, each displacement is represented with a case where Vm and Vmin=0 is standardized as 100. The result is shown in FIG. 10.

As a result, since the first voltage V1 has a peak in the vicinity of $-5.5$ V, and the displacement is small depending on the change of the first voltage V1, it is necessary to examine the drive waveform in consideration of this point.

As described above, in the invention, different drive waveforms have been used in the first drive mode and the second drive mode. In the second drive mode, a drive waveform in which the intermediate voltage Vm is equal to or lower than the coercive voltage is used, and in the first drive mode, a drive waveform in which the intermediate voltage Vm is higher than the coercive voltage, preferably, higher than $\Delta V$ is used.

Other Embodiments

An embodiment of the invention has been described. However, the basic configuration of the invention is not limited to that described above.

For example, the same effect can be obtained even when the positive polarity and the negative polarity are reversed in the above-described drive wave forms.

In addition, in the above-described embodiment, a silicon single crystal substrate has been exemplified as the flow path forming substrate 10. However, there is no particular limitation thereto and for example, materials such as an SOI substrate and glass may be used.

Further, in the above-described embodiment, the piezoelectric element 300 in which the first electrode 60, the piezoelectric layer 70, and the second electrode 80 are sequentially laminated on a substrate (the flow path forming substrate 10) has been exemplified. However, there is no particular limitation thereto, and for example, it is possible to apply the invention even to a liquid ejecting apparatus provided with a vertical vibration-type piezoelectric element in which a piezoelectric material and an electrode forming material are alternately laminated so as to expand in the axial direction.

Here, in the above-described embodiments, description has been given exemplifying an ink jet recording head as an example of a liquid ejecting head and an ink jet recording apparatus as an example of a liquid ejecting apparatus. However, the invention is widely aimed at liquid ejecting apparatuses in general and it is naturally possible to apply the invention to liquid ejecting apparatuses ejecting liquid other than ink. Examples of other liquid ejecting heads include a variety of recording heads that are used in an image recording apparatus, such as a printer, color material ejecting heads used to manufacture color filters, such as liquid crystal displays, electrode material ejecting heads used to form electrodes, such as organic EL displays and field emission displays (FED), biological organic substance ejecting heads used to manufacture bio chips, and the like, and it is possible to apply the invention to liquid ejecting apparatuses provided with these liquid ejecting heads.

The invention is also possible to apply piezoelectric devices other than liquid ejecting apparatus including a mortar, a sensor, and an electric generator, for example.

The entire disclosure of Japanese Patent Application No. 2013-17172, filed Aug. 21, 2013 is expressly incorporated by reference herein.

What is claimed is:

1. A piezoelectric device having a natural period Tc and a coercive electric field Ec, the piezoelectric device comprising:
   a piezoelectric element including a piezoelectric layer formed of a complex oxide having a perovskite structure including bismuth, iron, barium, and titanium, and a pair of electrodes placing the piezoelectric layer therebetween; and
   a driver supplying a drive waveform to the piezoelectric element, the drive waveform including:
   a standby process of applying intermediate voltage Vm to the piezoelectric element in a standby state;

a first voltage change process of changing the voltage applied to the piezoelectric element from the intermediate voltage Vm to a first voltage V1 having a polarity opposite to a polarity of the intermediate voltage Vm;

a first hold process of holding the voltage applied to the piezoelectric element to the first voltage V1;

a second voltage change process of changing the voltage applied to the piezoelectric element from the first voltage V1 to a second voltage V2 having a polarity same as the intermediate voltage Vm and higher value than the intermediate voltage Vm; and a second hold process of holding the voltage applied to the piezoelectric element to the second voltage V2, wherein, the piezoelectric element is driven with a first drive mode and a second drive mode, wherein, in the first drive mode, the piezoelectric element is driven at a first speed, and is held to the first voltage V1 in the first hold process during a first time defined based on the natural period Tc, and wherein, in the second drive mode, the piezoelectric element is driven at a higher speed than the first speed, and is held to the first voltage V1 in the first hold process during a second time shorter than the first time, and the intermediate voltage Vm is set to be equal to or lower than a voltage corresponding to the coercive electric field Ec.

2. The piezoelectric device according to claim 1,
wherein the intermediate voltage Vm is set to be higher than the voltage corresponding to the coercive electric field Ec in the first drive mode.

3. The piezoelectric device according to claim 2,
wherein an absolute value of the intermediate voltage Vm is set to be higher than a voltage difference between the first voltage V1 and the second voltage V2 in the first drive mode.

4. A liquid ejecting head comprising a piezoelectric according to claim 1.

5. A liquid ejecting apparatus comprising a liquid ejecting head according to claim 4.

6. A method of driving a piezoelectric device having a natural period Tc and a coercive electric field Ec, the piezoelectric device including a piezoelectric element comprising a piezoelectric layer formed of a complex oxide having a perovskite structure including bismuth, iron, barium, and titanium, and a pair of electrodes placing the piezoelectric layer therebetween, the piezoelectric element driven with a first drive mode and a second drive mode, the method comprising:

a standby process of applying intermediate voltage Vm to the piezoelectric element in a standby state;

a first voltage change process of changing the voltage applied to the piezoelectric element from the intermediate voltage Vm to a first voltage V1 having a polarity opposite to a polarity of the intermediate voltage Vm;

a first hold process of holding the voltage applied to the piezoelectric element to the first voltage V1;

a second voltage change process of changing the voltage applied to the piezoelectric element from the first voltage V1 to a second voltage V2 having a polarity same as the intermediate voltage Vm and higher value than the intermediate voltage Vm; and a second hold process of holding the voltage applied to the piezoelectric element to the second voltage V2, wherein, in the first drive mode, the method comprising driving the piezoelectric element at a first speed, and holding the first voltage V1 in the first hold process during a first time defined based on the natural period Tc, and wherein, in the second drive mode, the method comprising driving the piezoelectric element at a higher speed than the first speed, holding the first voltage V1 in the first hold process during a second time shorter than the first time, and setting the intermediate voltage Vm to be equal to or lower than a voltage corresponding to the coercive electric field Ec.

7. A method of driving a liquid ejecting head comprising a piezoelectric device having a natural period Tc and a coercive electric field Ec, the piezoelectric device including a piezoelectric element comprising a piezoelectric layer formed of a complex oxide having a perovskite structure including bismuth, iron, barium, and titanium, and a pair of electrodes placing the piezoelectric layer therebetween, the piezoelectric element driven with a first drive mode and a second drive mode, the method comprising:

a standby process of applying intermediate voltage Vm to the piezoelectric element in a standby state;

a first voltage change process of changing the voltage applied to the piezoelectric element from the intermediate voltage Vm to a first voltage V1 having a polarity opposite to a polarity of the intermediate voltage Vm;

a first hold process of holding the voltage applied to the piezoelectric element to the first voltage V1;

a second voltage change process of changing the voltage applied to the piezoelectric element from the first voltage V1 to a second voltage V2 having a polarity same as the intermediate voltage Vm and higher value than the intermediate voltage Vm; and a second hold process of holding the voltage applied to the piezoelectric element to the second voltage V2, wherein, in the first drive mode, the method comprising driving the piezoelectric element at a first speed, and holding the first voltage V1 in the first hold process during a first time defined based on the natural period Tc, and wherein, in the second drive mode, the method comprising driving the piezoelectric element at a higher speed than the first speed, holding the first voltage V1 in the first hold process during a second time shorter than the first time, and setting the intermediate voltage Vm to be equal to or lower than a voltage corresponding to the coercive electric field Ec.

* * * * *